United States Patent
Sandhu et al.

(10) Patent No.: US 6,190,992 B1
(45) Date of Patent: *Feb. 20, 2001

(54) METHOD TO ACHIEVE ROUGH SILICON SURFACE ON BOTH SIDES OF CONTAINER FOR ENHANCED CAPACITANCE/AREA ELECTRODES

(75) Inventors: Gurtej Singh Sandhu; Randhir P. S. Thakur, both of Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

This patent is subject to a terminal disclaimer.

(21) Appl. No.: 08/680,918

(22) Filed: Jul. 15, 1996

(51) Int. Cl.[7] ........................ H01L 21/20; H01L 21/8242
(52) U.S. Cl. ...................... 438/398; 438/243; 438/255; 438/386; 438/964
(58) Field of Search ................................ 438/398, 255, 438/964, 386, 243; 257/309

(56) References Cited

U.S. PATENT DOCUMENTS

| | | | |
|---|---|---|---|
| 5,043,780 | 8/1991 | Fazan et al. | 357/23.6 |
| 5,068,199 | 11/1991 | Sandhu | 437/52 |
| 5,130,885 * | 7/1992 | Fazan et al. | 257/309 |
| 5,191,509 * | 3/1993 | Wen | 438/964 |
| 5,244,842 * | 9/1993 | Cathey et al. | 438/398 |
| 5,266,514 | 11/1993 | Tuan et al. | 437/52 |
| 5,278,091 * | 1/1994 | Fazan et al. | 438/398 |
| 5,300,801 | 4/1994 | Blaock et al. | 257/309 |
| 5,340,765 * | 8/1994 | Dennison et al. | 438/398 |
| 5,364,814 * | 11/1994 | McQueen | 438/253 |
| 5,366,917 | 11/1994 | Watanabe et al. | 437/47 |
| 5,384,152 * | 1/1995 | Chu et al. | 438/386 |
| 5,407,534 * | 4/1995 | Thakur | 438/398 |
| 5,444,013 | 8/1995 | Akram et al. | 437/60 |
| 5,444,653 | 8/1995 | Nagasawa et al. | 365/149 |
| 5,445,986 | 8/1995 | Hirato | 437/60 |
| 5,447,878 | 9/1995 | Park et al. | 437/52 |
| 5,466,626 | 11/1995 | Armacost et al. | 437/60 |
| 5,468,671 | 11/1995 | Ryou | 437/52 |
| 5,480,826 | 1/1996 | Sugahara et al. | 437/52 |
| 5,481,127 | 1/1996 | Ogawa | 257/308 |
| 5,554,557 * | 9/1996 | Koh | 438/396 |
| 5,597,756 * | 1/1997 | Fazan et al. | 438/398 |
| 5,629,223 * | 5/1997 | Thakur | 438/398 |
| 5,658,381 | 8/1997 | Thakur et al. | 257/309 |
| 5,663,090 * | 9/1997 | Dennison et al. | 438/398 |
| 5,693,557 * | 12/1997 | Hirao et al. | 438/398 |
| 5,770,500 * | 12/1998 | Batra et al. | 438/255 |

OTHER PUBLICATIONS

T. Mine, et al., "Capacitance–Enhanced Stacked –Capacitator with engraved Storage Electrode for Deep Submicron DRAMs", *Solid State decives and Materials,* 137–140, (1989).

* cited by examiner

Primary Examiner—Charles L. Bowers, Jr.
Assistant Examiner—Toniae M. Thomas
(74) Attorney, Agent, or Firm—Schwegman, Lundberg, Woessner & Kluth, P.A.

(57) ABSTRACT

A method and apparatus for enhanced capacitance per unit area electrodes is utilized in semiconductor memory devices. The capacitance is enhanced by roughening the surface of the bottom electrode in such devices. In one embodiment of the invention, surface roughness is achieved on a polysilicon bottom capacitor electrode by depositing doped polysilicon on the outside surfaces of a bottom capacitor electrode and vacuum annealing. In another embodiment of the invention, surface roughness is achieved by depositing a $GeO_2$-embedded GeBPSG layer on a substrate, annealing, selectively etching to remove $GeO_2$, forming a container, and depositing a blanket rough polysilicon layer over the GeBPSG layer to replicate the underlying surface roughness.

13 Claims, 5 Drawing Sheets

METHOD TO ACHIEVE ROUGH SILICON SURFACE ON BOTH SIDES OF CONTAINER FOR ENHANCED CAPACITANCE/AREA ELECTRODES

This application is related to commonly assigned, co-pending U.S. Reissue application filed Apr. 5, 1996, of U.S. Pat. No. 5,300,801 entitled Stacked Capacitor Construction.

FIELD OF THE INVENTION

The present invention relates to methods and apparatus for enhanced capacitance per unit area electrodes utilized in semiconductor devices, and in particular, to a capacitor in a dynamic random access memory (DRAM) and a method of manufacturing the same.

BACKGROUND OF THE INVENTION

Dynamic random access memories (DRAMs) are the most widely used form of semiconductor memory to date. DRAMs are composed of a memory cell array and peripheral circuitry required for external input and output. Each memory cell array is formed of a plurality of memory cells for storing unit memory information. Typical memory cells are formed of a transistor, for opening and closing charge and discharge of the capacitor, and a capacitor, for storing electric charges therein. Of primary concern is maximizing the storage capacitance of each memory cell capacitor. This need is particularly acute in light of the demand for 256 Megabit DRAMs today and higher densities in the future, without increasing the chip space required to form the cell and, preferably, allowing a decrease in the chip space per cell. The importance of high density DRAMs cannot be overstated in today's competitive microelectronics market. Devices are becoming smaller, but they are required to perform many more functions at a faster rate.

One way to achieve greater capacitance per unit area is to roughen the surface of the capacitor plate, increasing the surface area. As can be seen from the following equation, the most important parameters involved in achieving maximum charge, Q, stored on the capacitor are the thickness of the insulator ($t_{ox}$), the area of the capacitor (A), and the dielectric constant ($\epsilon$). The voltage applied to the gate is $V_g$.

$$Q = (\epsilon \cdot A \cdot V_g)/t_{ox}$$

Increasing the capacitor area by forming the storage capacitor in a trench shape etched in the substrate is well known in the art, as well as using a stacked capacitor structure. Cylindrical trench stacked type capacitors feature a major part of the capacitor extending over the gate electrode and field isolating film of the underlying transistor. They are generally comprised of a base portion, a standing wall portion, a capacitor insulating film, and a cell plate. Modifications of trenched capacitors include sloping the standing wall portions of the trench, as shown in U.S. Pat. No. 5,444,013 to Akram et al., in order to further increase the area of the trench. However, yet another way of increasing the capacitance per unit area, as evidenced by the above equation, is to increase the capacitor plate surface area.

While the use of cylindrical trench stacked type capacitors increases the capacitance per unit area, this increase is not enough to meet the demands of today's devices. Further attempts to increase capacitance per unit area utilize roughening the surface of the standing wall portion of the DRAM, which comprises the lower plate electrode. A prior art method for forming a rough bottom plate electrode in a trenched capacitor is shown in FIG. 1. After the substrate 12 is etched, forming a trenched opening 14, the lower plate electrode 16 is formed, having a rough electrode layer 18 formed thereupon. The bottom plate electrode is formed of conductively-doped polysilicon layer 16 and the second, rough layer 18 is formed of hemispherical grain (HSG) polysilicon. Subsequently, a thin, insulating dielectric layer is deposited, and the top electrode is formed over the entire trenched structure. As can be seen from the above equation, this dielectric layer must be as thin as possible to maintain the maximum charge stored on the capacitor. Subsequently etching the structure leaves a capacitor cell formed, comprising the inside surface of the trenched opening.

Park et al. teach roughening a polysilicon capacitor surface in U.S. Pat. No. 5,447,878 by depositing silicon at 550 degrees Celsius, the phase transition point between amorphous silicon and polysilicon. Deposition at this temperature yields HSG polysilicon, with grain diameters of approximately 80 nanometers.

Further methods of roughening the bottom plate electrode include growth of "lattice-mismatched crystalline materials," as described in U.S. Pat. No. 5,384,152 to Chu et al. Such methods comprise forming a layer of roughened germanium over a substrate, formation of a bottom plate electrode over the germanium layer, followed by formation of a dielectric insulating layer over the bottom plate electrode, which replicates underlying surface roughness. The bottom plate electrode and dielectric layer must be of sufficient thinness, to facilitate replicating the underlying surface roughness of the germanium layer.

Other methods utilized to roughen the surface of the bottom plate electrode involve etching. One such method provides a spin on glass (SOG) film on the surface of the bottom plate electrode material, such as that described in "Capacitance-Enhanced Stacked-Capacitor with Engraved Storage Electrode for Deep Submicron DRAMS," Solid State Devices and Materials, 1989, pp. 137–140. The SOG material used contains photoresist materials, which facilitate subsequent photolithographic masking and etching of the bottom plate electrode, creating a rough surface.

U.S. Pat. No. 5,366,917, to Watanabe et al., describes roughening the surface of the bottom plate electrode by selective grain growth of polycrystalline silicon, which comprises the electrode material. Silicon is deposited on a substrate using a low pressure chemical vapor deposition (LPCVD) method. Deposition is carried out at the transition temperature between the crystalline phase and the amorphous phase. The silicon film is doped with either phosphorus, boron, or arsenic. Other embodiments comprise depositing amorphous silicon on a substrate, in a vacuum, or inert gas, ambient. Subsequent annealing in a similar ambient provides a roughened bottom plate electrode. The object of such methods is to increase the size of resulting grains. Conventionally, silicon grain diameters range from about 200 to 1,000 angstroms. Grain sizes resulting from such embodiments described above range from 300 to 1,700 angstroms. By controlling hydrogen content in the silicon film deposition chamber, the size and density of resulting grains can be further controlled. Increased concentrations of hydrogen result in larger grain sizes, and vice versa However, disadvantages of this technique include the fact that native oxides remaining on the surface of the film, and micro-crystallites remaining in the bulk of the amorphous silicon film, crystallize simultaneously with that on the outside surfaces of the film. This is undesirable, due to tendency of grains nucleating in the bulk to "swallow" grains nucleating on the surface. This increases the resulting grain size of the material, resulting in a smoother surface. Smoother surfaces decrease the overall capacitance of a memory cell. However, unless processing atmospheres are strictly controlled, and free of oxidizing species, elimination of native oxides and micro-crystallites in the bulk is near to impossible. Strictly controlling the processing atmosphere adds cost and complexity to the fabrication process.

Amorphous silicon is typically deposited using conventional chemical vapor deposition (CVD) techniques. Polysilicon is inherently composed of uneven sized grains throughout, as evidenced by the large number of convex/concave portions along the layer's edge. Therefore, the surface of the polysilicon layer may be uneven, depending on deposition conditions. Additions of dopants to the polysilicon film, such as arsenic and phosphorus, allow for growing larger silicon grains with diameters of up to between 1,000 angstroms to 10,000 angstroms from amorphous silicon, as described in U.S. Pat. No. 5,480,826 to Sugahara et al. However, it is undesirable to increase grain diameters to such large dimensions because it reduces the number of convex/concave portions of the polysilicon wall, resulting in a smoother surface and a smaller resulting surface area. As devices are decreasing in size, and demanded to perform more functions at a faster rate, it is undesirable to decrease the capacitor surface area because it decreases the amount of memory cell capacitance per unit area Other methods of obtaining surface roughness include roughening by oxidation as taught by Fazan et al. in U.S. Pat. No. 5,043,780 and Chan et al. In U.S. Pat. No. 5,082,797, or through an anodic process as taught by Sandu in U.S. Pat. No. 5,068,199. Both methods are imprecise and add process complexity to the fabrication process.

U.S. Pat. No. 5,384,152 to Chu et al. teaches heteroepitaxial deposition of germanium on the capacitor bottom electrode plate to increase the surface roughness. Chu et al. further report that the growth of any lattice-mismatched crystalline material, such as gallium arsenide or metal suicides, forms "islands," which give the surface its rough texture. Thereafter, a thin conductive polysilicon layer (approximately 500 angstroms thick) is deposited, replicating the rough surface structure of the underlying material. This method adds to process complexity due to the heteroepitaxial deposition step.

U.S. Pat. No. 5,466,626 to Armacost et al. teaches the use of ion sputtering to achieve surface roughness on capacitor surfaces, resulting in greater storage capacity. Armacost et al. achieves this through the use of an agglomerated material mask to selectively etch the surface, leaving recesses in the exposed surface areas. Drawbacks of this technique include the inability to provide a stable contact between the roughened surface and adjacent layers, such as the capacitor insulating film. This problem arises due to the sharp comers in the recesses which arise as a result of the etching process. Furthermore, uniformity of roughness is hard to control using this technique.

While all of the above methods create a roughened surface on the capacitor electrode plate to increase capacitance per unit area, they comprise complicated process steps. There is a need for a method of providing a rough capacitor plate surface using conventional processes, without expensive, time-consuming process steps. There is also a need to provide uniform surface roughness on a capacitor plate for a uniform capacitance effect along the plate. With the rapid decrease in device size, coupled with the demand for increased performance, a new, efficient technique must be used to further increase the capacitance per unit area in DRAM memory cells.

SUMMARY OF THE INVENTION

Enhanced capacitance per unit area of electrodes utilized in semiconductor devices is provided by roughening the surfaces of at least one side of the electrode films of a capacitor. A method for enhancing the capacitance per unit area of a semiconductor memory device roughens the bottom plate electrode in a memory cell capacitor. The method comprises the steps of: defining a recess in a semiconductor substrate; depositing a thin, first layer of doped polysilicon thereon; depositing a layer of amorphous silicon thereon; depositing a second layer of polysilicon thereon; forming the container, having a cross-section of exposed amorphous silicon; depositing a third layer of polysilicon on the exposed amorphous silicon; and, annealing to form a rough surface of the container. In one embodiment, the anneal step is comprised of a vacuum anneal at a pressure of at least $10^{-7}$ Torr, for at least thirty seconds in a rapid thermal chemical vapor deposition chamber. In another embodiment, the anneal step is comprised of a vacuum anneal at a pressure of at least $10^{-7}$ Torr, for at least five minutes in a low pressure chemical vapor deposition chamber.

Subsequent process steps comprise forming a thin dielectric layer on the roughened bottom plate electrode, and forming a conductive layer thereon.

The polysilicon dopant comprises an element, such as arsenic or phosphorus. Such dopants act as grain nucleation centers in subsequent annealing steps. The second layer of polysilicon can be doped, as well, to roughen both sides of the bottom plate electrode. The container then formed has rough, exposed outside and inside sidewalls. The length of the outside sidewall is greater than the length of the inside sidewall, to further increase the capacitance of the memory cell. The outside sidewall length is controlled by the degree of etching. By etching the container to expose roughened surfaces on both outside and inside container walls, the capacitance of the memory cell is approximately doubled, compared to capacitors, which are not formed in such a manner. The process steps used to achieve further increased capacitance, by increasing the surface area of the bottom plate electrode by roughening its surface, are fewer and simpler than those in prior art methods.

In a second embodiment of the invention, the bottom plate electrode is roughened to increase the capacitance of a memory cell. A method for enhancing the capacitance per unit area of a semiconductor memory device comprises the steps of: defining a recess in a semiconductor substrate; depositing a layer of germanium borophosphosilicate (BPSG) thereon, using chemical vapor deposition in an oxidizing ambient to form germanium dioxide embedded therein; annealing the substrate; etching to remove the germanium dioxide; depositing a polysilicon, or amorphous silicon, layer thereon; and, forming a container. The container is formed using chemical mechanical polishing and oxide etching. The degree of etching determines the container's surface area. The outside surface of the container is etched to such a degree that the outside sidewall length is greater than the inside sidewall length. The annealing step is comprised of annealing at a temperature of at least 700 degrees Celsius, to buckle the exposed surface of the germanium BPSG film.

Subsequent process steps comprise forming a thin dielectric layer on the roughened container surface, and forming a conductive layer thereon. These layers replicate the underlying surface roughness of the bottom plate electrode. By etching the container to expose roughened surfaces on both outside and inside container walls, the capacitance of the memory cell is approximately doubled, compared to capacitors, which are not formed in such a manner. The process steps used to achieve further increased capacitance, by increasing the surface area of the bottom plate electrode, are fewer and simpler than those in prior art methods. This invention also benefits from the use of BPSG, which lowers the reflow temperature. Lowering the reflow temperature decreases the thermal budget for device fabrication.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims. Numbering in the Figures is usually done with the hundreds and thousands digits corresponding to the figure number, with the exception that the same components may appear in multiple figures.

The embodiments of the method and apparatus described in the present invention utilize a three-dimensional container for a bottom electrode of a capacitor structure for a DRAM memory cell. In a first embodiment of a device, having a thickness of at least 0.3 microns, incorporating the present invention indicated generally at 210 in FIGS. 2a, 2b, 2c, 2d, and 2e, a thin (at least 50 angstroms) nucleation layer of poly-crystallites 212 is formed over an insulative oxide layer 216, covering a defined buried contact 218 and trench 220. Typically, such poly-crystallites are formed using silane, or disilane, chemistries at temperatures between approximately 450 to 750 degrees Celsius, doped with an impurity such as phosphorus, arsenic, or antimony. The resulting poly-crystallites are comprised of this doped polysilicon. The concentration of dopants ranges from between approximately $1 \times 10^{19}$ to $1 \times 10^{22}$ atoms/cm$^3$.

Figure 1:
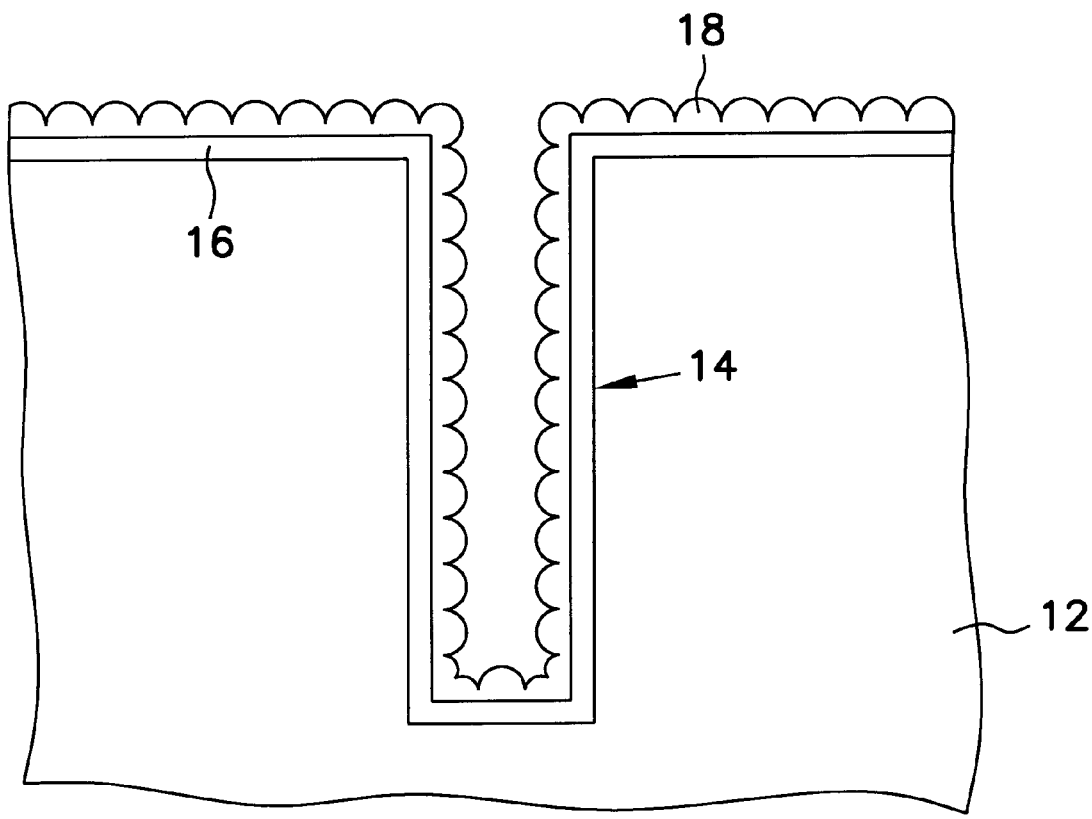
FIG. 1 is a cross-sectional representation of a prior art DRAM bottom plate electrode.
Figure 2A:
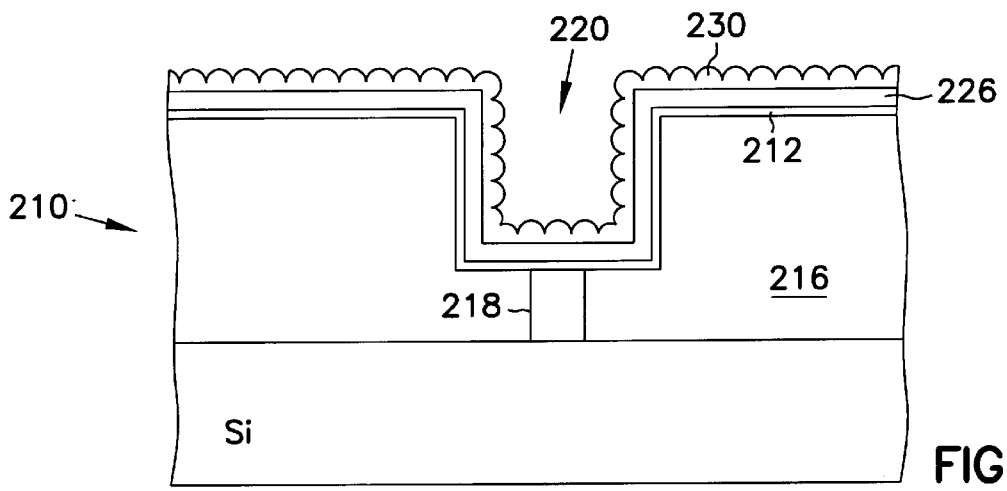
FIGS. 2a, 2b, 2c, 2d, and 2e are cross-sectional representations illustrating steps of forming a trench capacitor in accordance with a first embodiment of the present invention.

As shown in FIG. 2a, creation of poly-crystallite layer 212 is followed by deposition of an amorphous silicon layer 226, having a thickness of at least 150 angstroms. The amorphous silicon layer is subsequently deposited with a blanket rough polysilicon layer 230. This layer 230 is doped, but need not be, with an impurity, such as phosphorus, arsenic, or antimony. The concentration of dopants ranges from between approximately $1 \times 10^{19}$ to $1 \times 10^{22}$ atoms/cm$^3$. Layer 230 is at least 300 angstroms thick. Either a low pressure chemical vapor deposition (LPCVD), rapid thermal chemical vapor deposition (RTCVD), or plasma process chamber is used to form such layers.

Figure 2B:
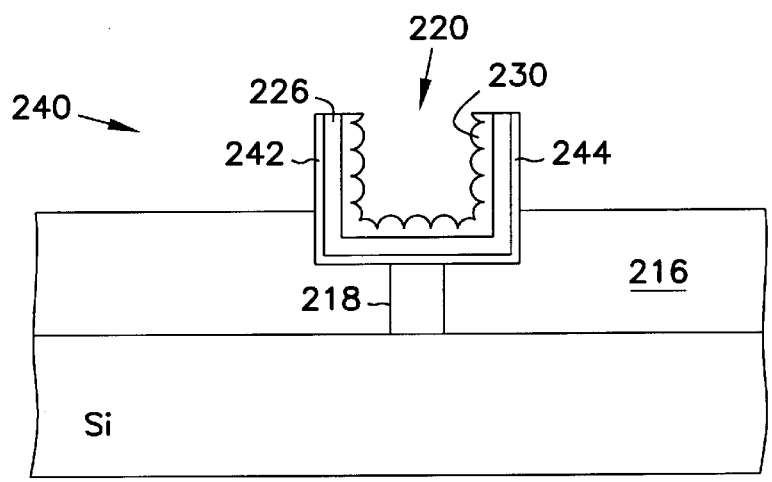
Figure 2C:
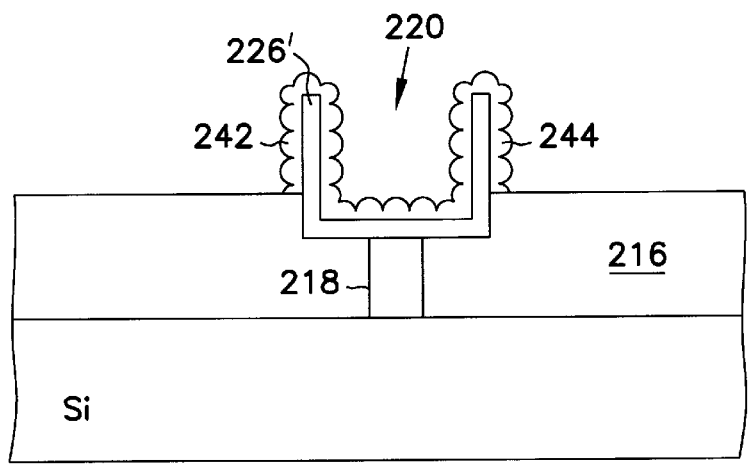
Figure 2D:
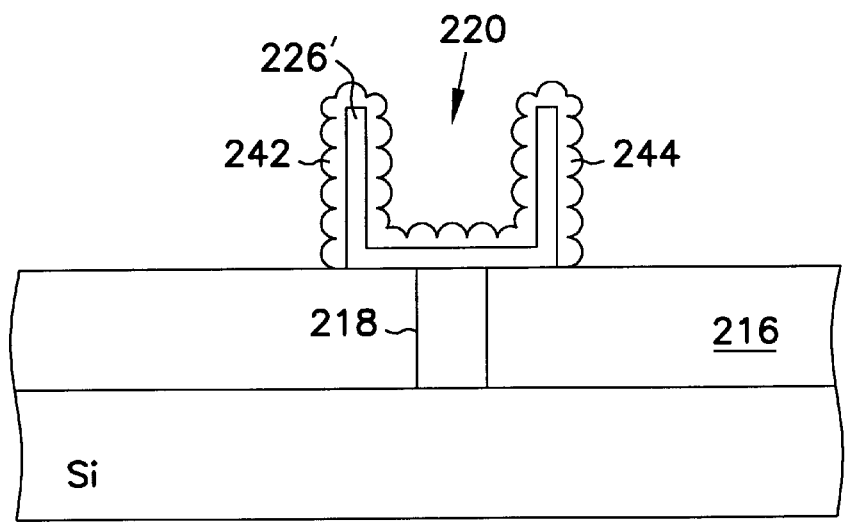

A container 240, with standing wall portions 242, 244, as shown in FIG. 2b, is formed by chemical mechanical polishing (CMP) and an oxide 216 etch, such that the container structure is clearly defined. The CMP removes material across the surface of the device to expose a cross section of the wall portions. The etch can be performed to expose the outside sidewalls of the container to a depth approximately equal to the depth of the container's inside bottom, as shown in FIG. 2c, or greater, as shown in FIG. 2d. This provides for approximately double the amount of capacitance of prior art techniques, which do not etch back the surrounding oxide layer 216 to such a degree. The smooth, exposed surfaces of the container are then coated with polysilicon nucleation centers. Typically, these nucleation centers are of the same type as those which form the previously described poly-crystallite layers. These nucleation centers are formed using low partial pressure silane, or disilane, chemistries in the temperature regime of between approximately 450 to 750 degrees Celsius, doped with an impurity such as phosphorus, arsenic, or antimony. The concentration of dopants ranges from between approximately $1 \times 10^{19}$ to $1 \times 10^{22}$ atoms/cm$^3$.

To complete roughening of the container's outer surface, as shown in FIG. 2c, an anneal and in-situ clean is performed. A vacuum anneal at a pressure of at least $10^{-7}$ Torr for at least 30 seconds is performed in a RTCVD processing chamber. Alternatively, a vacuum anneal at a pressure of at least $10^{-7}$ Torr for at least 5 minutes is performed in a LPCVD processing chamber.

Figure 2E:
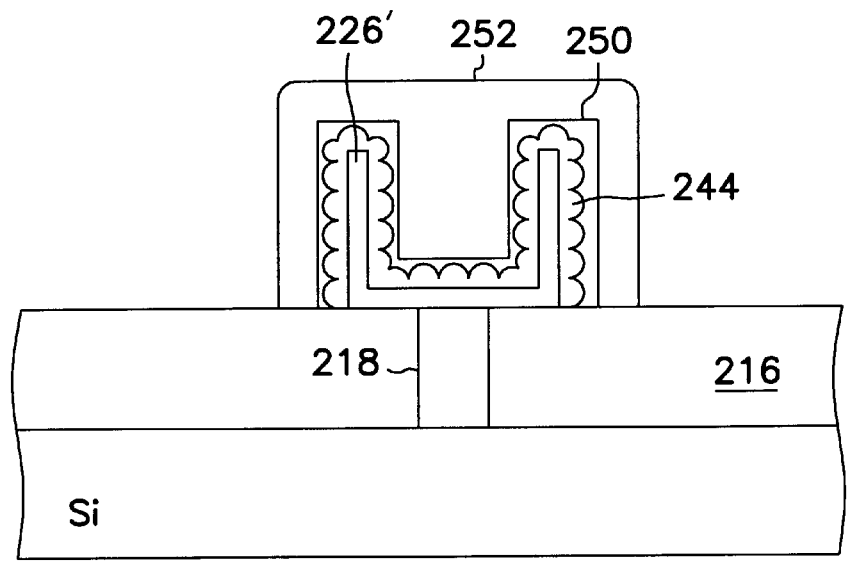

Subsequent process steps are performed using techniques well known to one skilled in the art. A thin dielectric layer 250, shown in FIG. 2e, is formed on the rough underlying bottom plate electrode, replicating the roughness of the underlying conductor layer. A conductive layer 252 is then formed on the dielectric layer 250, comprising a top capacitor plate electrode. Typically, an increase of up to two times in capacitance is achieved over smooth layers, using this embodiment of the invention. The further advantages of this invention are that the process steps needed to form such rough bottom plate electrode surfaces are fewer and simpler than those used prior art methods.

In a second embodiment of a device, having a thickness of at least 0.3 microns, incorporating the present invention indicated generally at 310 in FIGS. 3a, 3b, 3c, and 3d, a thin (at least 100 angstroms), rough layer 312 of germanium dioxide (GeO$_2$) embedded germanium borophosphosilicate glass (GeBPSG) is deposited over an insulative oxide layer 316, covering a defined buried contact 318 and trench 320. The GeBPSG films are deposited using a combination of silane and tetraethyloxysilicate (TEOS), and an organometallic source for doping the films. The organometallic source is comprised of triethylphosphate (TEPO), for a phosphorus type dopant, and triethylborane (TEB), for a boron type dopant. The germanium source can be either organic, or inorganic. It is desirable for the BPSG to be heavily-doped with Ge, in order to form GeO$_2$ precipitates. GeO$_2$ precipitates form, due to depositing the GeBPSG film in an oxidizing ambient.

The concentration of germanium ranges from between approximately 1% to 30%. Best results are obtained using a concentration range between 5% to 10%. The concentration of boron and phosphorus ranges from between approximately 1% to 10% for each type of dopant. Best results are obtained using a concentration range of between approximately 2% to 5% for boron and between approximately 2% to 7% for phosphorus. The GeBPSG deposition is carried out in any type of chemical vapor deposition (CVD) equipment in an oxidizing ambient at temperatures between approximately 400 to 600 degrees Celsius.

When the GeO$_2$-rich doped oxide film is annealed in a furnace system, using rapid thermal processing (RTP), at a temperature of at least 700 degrees Celsius, its surface area is increased. The surface area is increased due to the tendency for such a film to "wrinkle," or "buckle," at the surface, with, or without a silicon electrode in place, upon annealing.

GeBPSG significantly reduces the reflow temperature, when used as an insulator, lowering the thermal budget of DRAM processing. GeBPSG also reacts with the outside surface of the capacitor electrode to make it rough, increasing the capacitance by increasing the surface area of the capacitor plates. Prior art techniques have not provided for this degree of increased surface area.

Subsequently, a wet etch selectively etches away the GeO$_2$, formed during the anneal step, to further roughen the surface 330. A blanket rough polysilicon layer 332 is then deposited over the device 310. This layer is at least 300 angstroms thick, deposited using LPCVD, RTCVD, or a plasma process chamber. The roughness from the underlying GeBPSG is replicated and enhanced in the polysilicon layer 332. Alternatively, amorphous silicon is substituted for the blanket rough polysilicon layer 332. Such layer, whether comprised of amorphous silicon or polysilicon, is doped for increased conductivity.

Figure 3A:
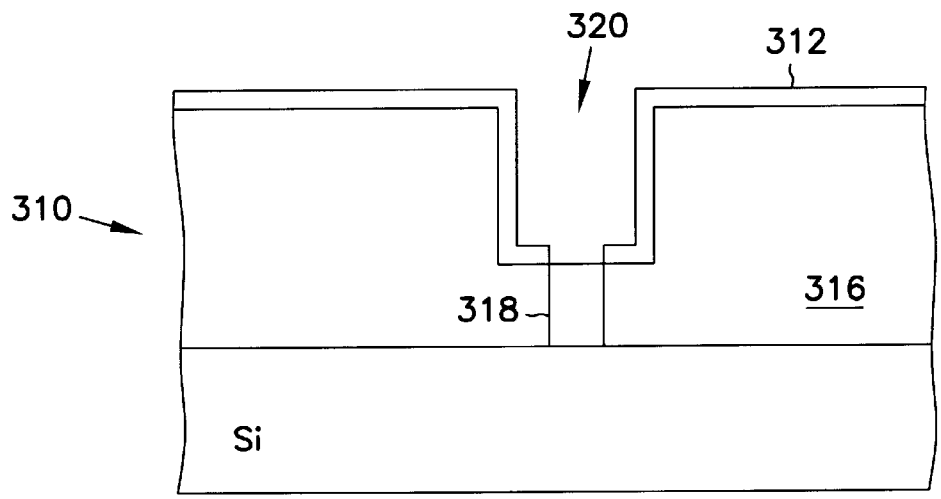
FIGS. 3a, 3b, 3c, and 3d are cross-sectional representations illustrating steps of forming a trench capacitor in accordance with a second embodiment of the present invention.
Figure 3B:
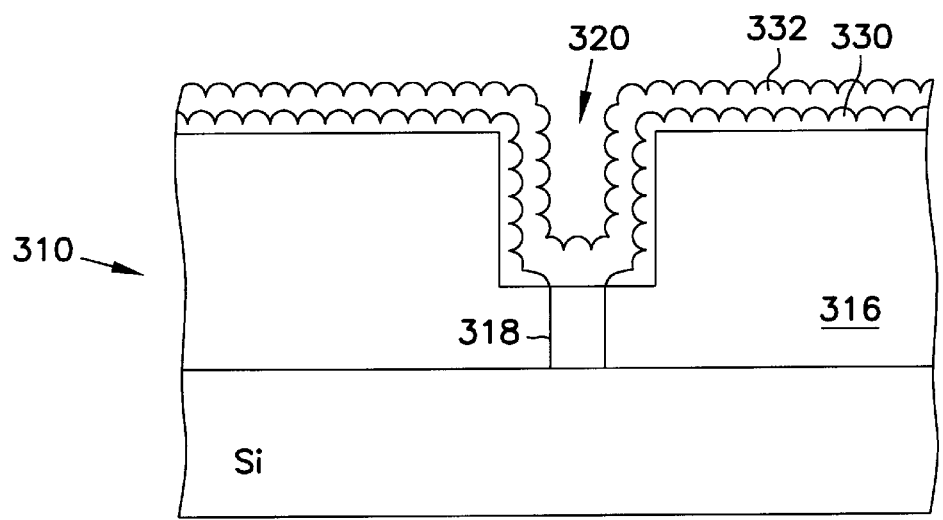
Figure 3C:
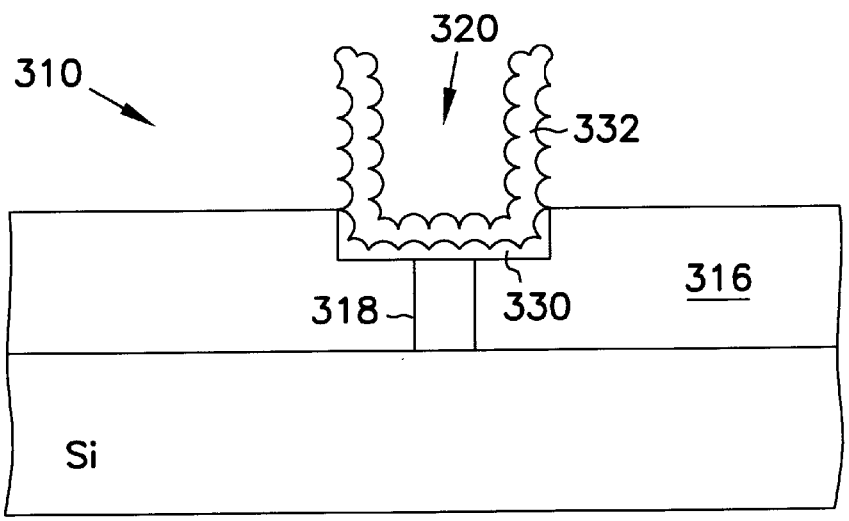
Figure 3D:
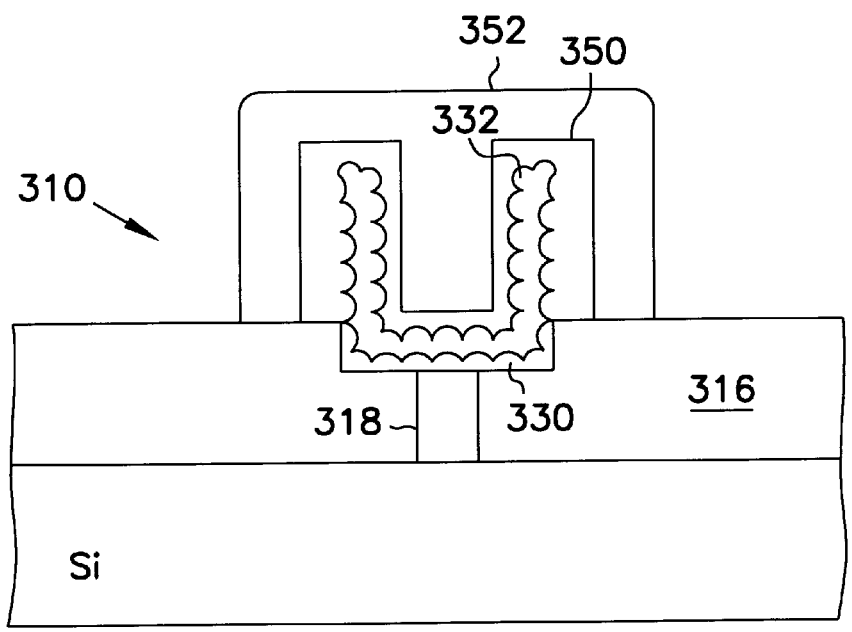

The container, with standing wall portions, is then formed by CMP and an oxide and BPSG etch, as in the first embodiment. The outside sidewalls of the container are etched back to a level almost consistent with the bottom of the container, as shown in FIG. 3c. The amount of etchback determines the amount of resulting capacitor surface area, due to the increased plate area along the outside of the sidewalls. The capacitance of the memory cell is further increased by etching, to form a container having an outside sidewall length greater than an inside sidewall length. The surface roughening of the outside and inside of the container is complete. The bottom plate electrode is rough from both the inside and outside of the container, essentially doubling the capacitance achieved by prior art methods, which do not etch back the outside sidewalls of the container.

Furthermore, the capacitance of the cell is increased due to the increased surface area of a subsequently deposited dielectric film 350 and conductor layer 352, which replicate the underlying surface roughness of the bottom plate electrode. Such subsequent layers are deposited using techniques well known to one skilled in the art.

The process steps used to achieve further increased capacitance, by increasing the surface area of the bottom plate electrode, are fewer and simpler than those used in prior art methods. This invention also benefits from the use of BPSG, which lowers the reflow temperature. Lowering the reflow temperature decreases the thermal budget for device fabrication.

It is to be understood that the above description is intended to be illustrative, and not restrictive. Many other embodiments will be apparent to those of skill in the art upon reviewing the above description. For example, the shape of the storage electrode may be a plain cubic structure, a cylindrical structure, a fin-type structure, or a stacked trench type structure. The scope of the invention should, therefore, be determined with reference to the appended claims, along with the full scope of equivalents to which such claims are entitled.

What is claimed is:

1. A method for enhancing the capacitance per unit area of a semiconductor memory device comprising the steps of:
    a) defining a recess in a semiconductor substrate;
    b) depositing a layer of germanium borophosphosilicate thereon, using chemical vapor deposition in an oxidizing ambient to form germanium dioxide embedded therein;
    c) annealing the substrate;
    d) etching to remove the germanium dioxide;
    e) depositing a bottom plate electrode layer thereon;
    f) forming a container;
    g) forming a thin dielectric layer thereon; and,
    h) forming a conductive layer thereon.

2. The method of claim 1, wherein the germanium borophosphosilicate film is deposited to a thickness of at least 100 angstroms at a temperature between approximately 400 to 600 degrees Celsius, having a germanium concentration of between approximately 1% to 30%.

3. The method of claim 1, wherein the annealing step is comprised of annealing at a temperature of at least 700 degrees Celsius, to buckle the exposed surface of the germanium borophosphosilicate film.

4. The method of claim 1, wherein the bottom plate electrode is comprised of at least one of: polysilicon and amorphous silicon.

5. The method of claim 1, wherein the container is formed, using chemical mechanical polishing and an oxide and borophosphosilicate etch comprised of a trench, with exposed outside and inside sidewalls, having an outside sidewall length greater than half of the inside sidewall length.

6. The method of claim 5, wherein the length of the outside sidewall is greater than the length of the inside sidewall.

7. A method for forming an enhanced capacitance per unit area semiconductor capacitive memory device, comprising the steps of:
    a) forming a recess in a semiconductor substate, having a layer of germanium borophosilicate thereon;
    b) forming a rough conductive layer on the germanium borophosphosilicate;
    c) forming a container, having inside and outside sidewalls comprised of the rough conductive layer;
    d) forming a thin dielectric layer on the rough conductive layer; and,
    e) forming a second conductive layer on the thin dielectrc layer.

8. The method of claim 7, wherein the germanium borophosphosilicate layer is deposited to a thickness of at least 100 angstroms, at a temperature between approximately 400 to 600 degrees Celsius.

9. The method of claim 7, wherein the germanium borophosphosilicate (BPSG) layer is comprised of BPSG, doped with germanium, having a germanium concentration of between approximately 1% to 30%.

10. The method of claim 7, wherein the rough conductive layer is comprised of at least one of: polysilicon and amorphous silicon, and is formed using an annealing step after the material is deposited, at a temperature of at least 700 degrees Celsius, to buckle the exposed surface of the germanium borophosphosilicate film.

11. The method of claim 7, wherein the container is formed, using chemical mechanical polishing and an oxide and borophosphosilicate etch.

12. The method of claim 7, wherein the length of the outside sidewall of the container is greater than half the length of the inside sidewall of the container.

13. The method of claim 12, wherein the length of the outside sidewall of the container is greater than the length of the inside sidewall of the container.

* * * * *